(12) United States Patent
Huss et al.

(10) Patent No.: US 10,732,598 B2
(45) Date of Patent: Aug. 4, 2020

(54) METHOD FOR THE TRANSFORMATION OF POSITION INFORMATION INTO A LOCAL COORDINATES SYSTEM

(71) Applicant: Continental Teves AG & Co. oHG, Frankfurt (DE)

(72) Inventors: Sorin Huss, Heidelberg (DE); Attila Jaeger, Darmstadt (DE)

(73) Assignee: Continental Teves AG & Co. OHG, Frankfurt (DE)

(*) Notice: Subject to any disclaimer, the term of this patent is extended or adjusted under 35 U.S.C. 154(b) by 259 days.

(21) Appl. No.: 15/827,699

(22) Filed: Nov. 30, 2017

(65) Prior Publication Data

US 2018/0081337 A1 Mar. 22, 2018

Related U.S. Application Data

(63) Continuation of application No. PCT/EP2016/062279, filed on May 31, 2016.

(30) Foreign Application Priority Data

Jun. 1, 2015 (DE) .......................... 10 2015 210 096

(51) Int. Cl.
*G05B 19/042* (2006.01)
*G05B 17/02* (2006.01)
(Continued)

(52) U.S. Cl.
CPC .......... *G05B 19/0426* (2013.01); *G01S 19/42* (2013.01); *G05B 17/02* (2013.01);
(Continued)

(58) Field of Classification Search
CPC ................ G05B 19/0426; G05B 17/02; G05B 2219/23456; G05B 2219/23452;
(Continued)

(56) References Cited

U.S. PATENT DOCUMENTS

2010/0191461 A1 7/2010 Zeng
2014/0379205 A1 12/2014 Muetzel et al.

FOREIGN PATENT DOCUMENTS

CN 1864075 A 11/2006
CN 104359492 A 2/2015
(Continued)

OTHER PUBLICATIONS

Santamaria, Amilcare Francesco, et al, An efficient traffic management protocol based on IEEE802.11p standard, University of Calabria, DIMES Department, Rende(CS),87036 Italy. pp. 634-641.
(Continued)

*Primary Examiner* — Brian P Sweeney

(57) ABSTRACT

A method for the transformation of information relating to at least one position on a globe from a first global coordinates system into a second local coordinates system, where the position in the first global coordinates system is provided by information relating to the longitude and a latitude, and the position in the second local coordinates system is provided in terms of two axes arranged orthogonally to one another. The method includes receiving a signal containing information relating to the position by means of an antenna, determining a first distance (x) between the position and a reference longitude for the first local axis using a calculation unit, and determining a second distance (y) between the position and a reference latitude for the second local axis by means of the calculation unit. The reference longitude is selected in such a way that it is near to the position.

12 Claims, 3 Drawing Sheets

(51) Int. Cl.
  *G06F 17/50* (2006.01)
  *G06F 8/61* (2018.01)
  *H04W 4/02* (2018.01)
  *G01S 19/42* (2010.01)
  *G06F 30/20* (2020.01)

(52) U.S. Cl.
  CPC .............. *G06F 8/61* (2013.01); *G06F 30/20* (2020.01); *H04W 4/027* (2013.01); *G05B 2219/23446* (2013.01); *G05B 2219/23452* (2013.01); *G05B 2219/23456* (2013.01)

(58) Field of Classification Search
  CPC ......... G05B 2219/23446; G01S 19/42; H04W 4/027; G06F 17/5009; G06F 8/61; G06F 30/20
  USPC ........................................................ 701/454
  See application file for complete search history.

(56) References Cited

FOREIGN PATENT DOCUMENTS

| | | | |
|---|---|---|---|
| CN | 104602336 A | | 5/2015 |
| EP | 2503288 A2 | | 9/2012 |
| WO | 2014083410 A1 | | 6/2014 |
| WO | WO 2014/083410 A1 | * | 6/2014 |

OTHER PUBLICATIONS

Pingzeng, Liu, et al, Obstacle Avoidance System for Agricultural Robots Based on Multi-sensor Information Fusion, Department of Information Science and Engineering Shandong Agricultural University, Tainan, China. Beijing University of Aeronautics and Astronautics, Bejiing China. pp. 1181-1185.

Mar, J. et al, Simulations of the Positioning Accuracy of Integrated Vehicular Navigations Systems, IEE Proceedings: Radar, Sonar & Navigtion, Institution of electrical engineers, GB, Bd. 143, No. 2 , Apr. 3, 1996; (Apr. 3, 1996) , Seiten 121-128, XP006006703, DOI: 10.1049/IP-RSN:19960222, Seite 128, Anhang.

Tsukioka, Satoshi, et al, The Navigation System for an Expendable Fiber Cable ROV "UROV", Japan Marine Science and Technology Center, Natsushima, Yokosuka, Kanagawa 237, Japan, pp. 1985-1990.

Jaeger, Attila, et al, Novel Techniques to Handle Rectangular Areas in Car-to-X Communications Applications, Integrated Circuits and Systems Lab Technische Unversitat Damstadt, Hoschulstrape, Darnstadt Germany, pp. 575-582.

International Search Report and Written Opinion dated Aug. 17, 2016 from corresponding International Patent Application No. PCT/EP2016/062279.

German Search Report dated Apr. 6, 2016 for corresponding German Patent Application No. 10 2015 210 096.0.

Chinese First Office Action dated Apr. 29, 2020 for the counterpart Chinese Invention Application No. 201680024823.5.

\* cited by examiner

METHOD FOR THE TRANSFORMATION OF POSITION INFORMATION INTO A LOCAL COORDINATES SYSTEM

CROSS-REFERENCE TO RELATED APPLICATIONS

This application claims the benefit of PCT Application PCT/EP2016/062279, filed May 31, 2016, which claims priority to German Patent Application 10 2015 210 096.0, filed Jun. 1, 2015. The disclosures of the above applications are incorporated herein by reference.

FIELD OF THE INVENTION

The invention relates to a method for the transformation of information relating to at least one position in a global coordinates system into a second local coordinates system, as well as a corresponding method for the reverse transformation of the position information, and a vehicle system for carrying out such a transformation.

BACKGROUND OF THE INVENTION

The position data of a vehicle form a basic parameter for many vehicle-to-X applications (hereafter abbreviated to V2X). In this case, the position data relates to a statement about the position of the system's own vehicle or ego-vehicle. In addition, messages received from other vehicles or road users, for example DENM messages, also contain corresponding position information or data which has/have been generated by the sender. The position information contained in DEMNs is in the WGS-84 format.

In accordance with the WGS-84 format, the position information is indicated, inter alia, by using longitudes and latitudes. While it is true that this information is universally valid across the globe, utilizing the information in a V2X application is cumbersome or requires a high computational cost.

The inventor of this application had therefore developed a method in which the global position information is converted into a local coordinates system. In this case, he uses the distance of the current position from Greenwich and the equator, and uses these distances as position information for a two-axis coordinates system. More details about the method may be found in the specialist article "Novel Techniques to Handle Rectangular Areas in Car-to-X Communication Applications", Proceedings of the 10th International Conference on Informatics in Control, Automation and Robotics (ICINCO)—Special Session on Intelligent Vehicle Controls & Intelligent Transportation Systems (IVC&ITS), Reykjavík, Iceland, July 2013.

However, the disadvantage of this known method is that as the distance from Greenwich increases, a distortion error occurs during the transformation of the position information so that the method only provides usable results in the vicinity of Greenwich. This fact is not acceptable for methods or systems which are intended to be used around the world.

SUMMARY OF THE INVENTION

The object of the invention is therefore to further develop the known method in such a way that it may be used universally.

The object is achieved in accordance with a method according to the present invention, where the reference longitude is selected near to the position to be converted or adjacent thereto.

It is possible to map a position within a two-dimensional plane within the second local coordinates system, which makes it easy to use for calculations. Ideally, the local coordinates system is a Cartesian coordinates system. The local coordinates system is generated by the first and second axes or the x-axis and the y-axis. The x-axis runs substantially horizontal, i.e. parallel to a latitude. The y-axis runs substantially parallel to a longitude. Using the calculated distance from a reference longitude or reference latitude, a position may be indicated in a metric unit for the x-axis and the y-axis of the local coordinates system. The equator is preferably used as the reference latitude. Ideally, the point of origin of the local coordinates system is located at the intersection of the reference longitude and reference latitude.

In this case, the invention is based on the realization that the distance calculation is simplest if distances run parallel to a longitude or latitude. The assumption underlying the method that the globe comprises a spherical shape reinforces this.

Due to the geographical expanse of a latitude, the method may be executed without noticeable errors, even if the distance is not calculated exactly. The wording "identical" is therefore not to be understood in a geometric sense within the meaning of this invention. A minor deviation is therefore permissible in this respect, as long as it does not noticeably impair the quality of the position information in the local coordinates system.

The method is suitable both for the transformation of positions which are detected, for example, by an ego-vehicle, and positions supplied by other vehicles or road users. The antenna for receiving the position information or signals may therefore be GNSS antennas or antennas for transmitting data, e.g. in accordance with the IEEE 802.11, 3G or LTE standards.

According to an advantageous embodiment of the method according to the invention, a longitude near to the position or adjacent to this position, preferably within a range of up to 10 km, is selected as the reference longitude. The invention is further based on the realization that it is not necessary or advantageous to link the first reference point to Greenwich or the prime meridian. In addition, the advantage of selecting the reference longitude according to the invention is also that due to a smaller expanse of the area observed the assumption of a two-dimensional plane is more applicable to the observed area or region. The maximum distance between the reference longitude and the position is preferably less than 10 kilometers, particularly preferably less than 1 kilometer. These distances have proven to be practicable in initial experiments.

According to an advantageous embodiment of the method according to the invention, the distances are calculated in radians. In this way, the computational cost for determining the distances may be further reduced.

According to an advantageous embodiment of the method according to the invention, the distance for the first local axis is calculated by using the equation $$x\_P = r * (\lambda\_P - \lambda\_R) * \cos(\varphi\_P)$$

where
r is the earth radius in accordance with WSG-84,
$\lambda\_P$ is the longitude of the position,
$\lambda\_R$ is the reference longitude, and
$\varphi\_P$ is the latitude of the position.

According to an advantageous embodiment of the method according to the invention, the distance for the second local axis is calculated using the equation $$y\_P = r * \varphi\_P.$$

According to an advantageous embodiment of the method according to the invention, the reference latitude is selected near to the position. The aforementioned equations change in such a case to $$y\_P = r * (\varphi\_P - \varphi\_R)$$

where $\varphi\_R$ is the reference latitude. The advantage of this is that the values for the y-coordinates become smaller when a suitable choice of reference latitude is made, such that in the event of a limited bit number, for example 32-bit, the local y-coordinates may still be accurately mapped despite the limited bit number.

According to an advantageous embodiment of the method according to the invention, the longitude of the ego-position or the vehicle's own position is used as the reference longitude and the latitude of the ego-position or the vehicle's own position is used as the reference latitude. In particular, the ego-position may also be used as the point of origin of the local coordinates system. This embodiment is particularly advantageous for using the method in V2X applications, since the immediate surroundings are generally observed in V2X applications and therefore the distortion error only has an imperceptible effect in such a case. Additional positions are then assigned within the local coordinates system relative to the ego-position. The aforementioned equations change in such a case to $$x\_P = r * (\lambda\_P - \lambda\_0) * \cos(\varphi\_P)$$

$$y\_P = r * (\varphi\_P - \varphi\_0)$$

where $\lambda\_0$, $\varphi\_0$ is the longitude and latitude of the ego-position $P\_0$, or of the point of origin of the local coordinates system.

According to an advantageous embodiment of the method according to the invention, the equation may be modified for the x-coordinate in such a manner that the cosine of the reference latitude or of the point of origin is used instead of $\cos(\varphi\_P)$, namely $\cos(\varphi\_R)$ or $\cos(\varphi\_0)$. If the reference longitude and reference latitude remain the same, that is to say generally during an application period, this value always remains the same for all coordinates and in both directions of the conversion and therefore only has to be determined once. The computational cost may therefore be additionally reduced.

According to an advantageous embodiment of the method according to the invention, the reference longitude and reference latitude are fixed for an application period. The embodiment makes it possible to generate a temporary local coordinates system which is suitable for applications in which a limited region has to be defined.

According to an advantageous embodiment of the method according to the invention, the application period is shorter than 120 seconds, in particular shorter than 60 seconds, particularly preferably shorter than 30 seconds. The aforementioned values have proven to be particularly practicable for use in V2X applications.

According to an advantageous embodiment of the method according to the invention, the duration of the application period is adjusted as a function of the vehicle speed. In this way, the application duration may be adapted as precisely as possible to the respective driving situation, e.g. driving on the motorway, a country road or in the city, using this alternative embodiment.

The object is further achieved according to a second aspect of the invention wherein the method according to the invention makes possible the reverse transformation of position information into a global coordinates system so that the position information, for example coupled to additional information, may be sent to other vehicle components or road users. The selection of the equations is dependent on whether the equator or a different latitude has been selected as the reference latitude.

Furthermore, the object is achieved according to a third aspect of the invention using a vehicle system, wherein the reference longitude is selected in such a way that it is near to the position or positions to be converted.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The invention will be described in more detail below with reference to an embodiment example and figures, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
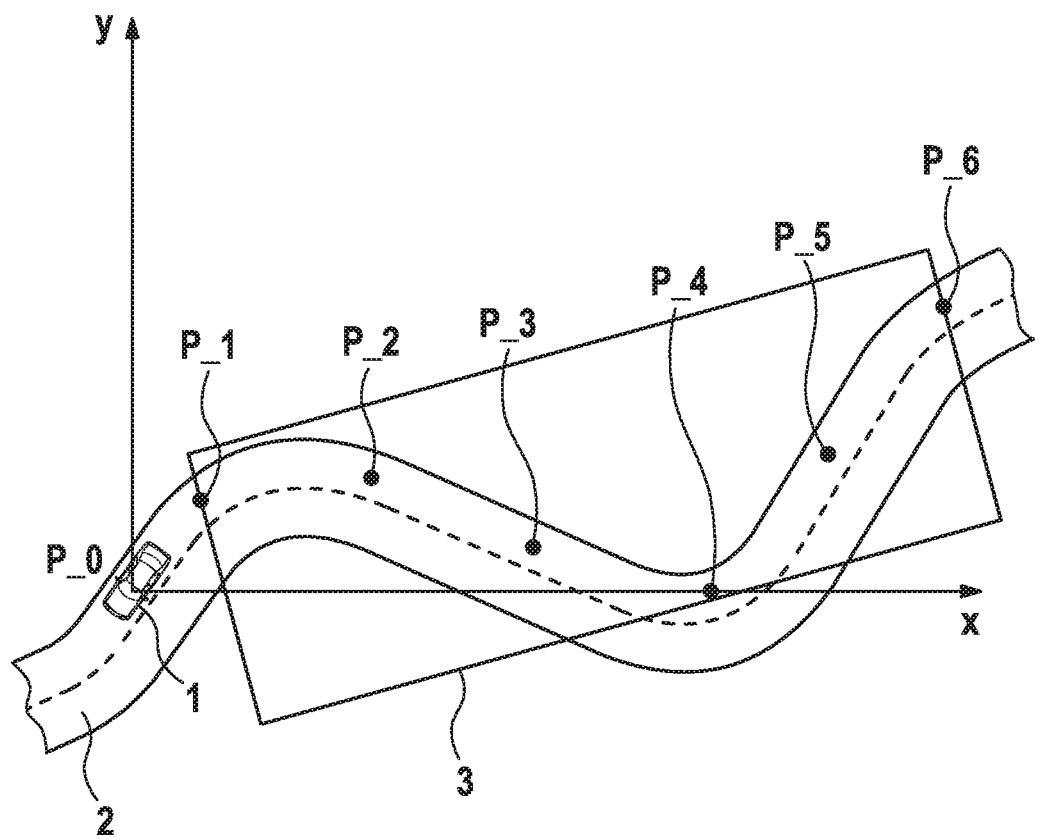
FIG. 1 shows an exemplary representation of multiple positions in a local coordinates system.

FIG. 1 shows a scenario in which the method according to the invention is being used. It shows a vehicle 1 which is driving along a road 2 and which detects multiple positions $P\_1$ to $P\_6$ at regular intervals along the road. Each of these positions $P\_1$ to $P\_6$ has been detected by means of a GNSS receiver onboard the vehicle. However, it is also conceivable that such positions are also transmitted by other road users. This fact is immaterial for the method according to the invention.

Figure 2:
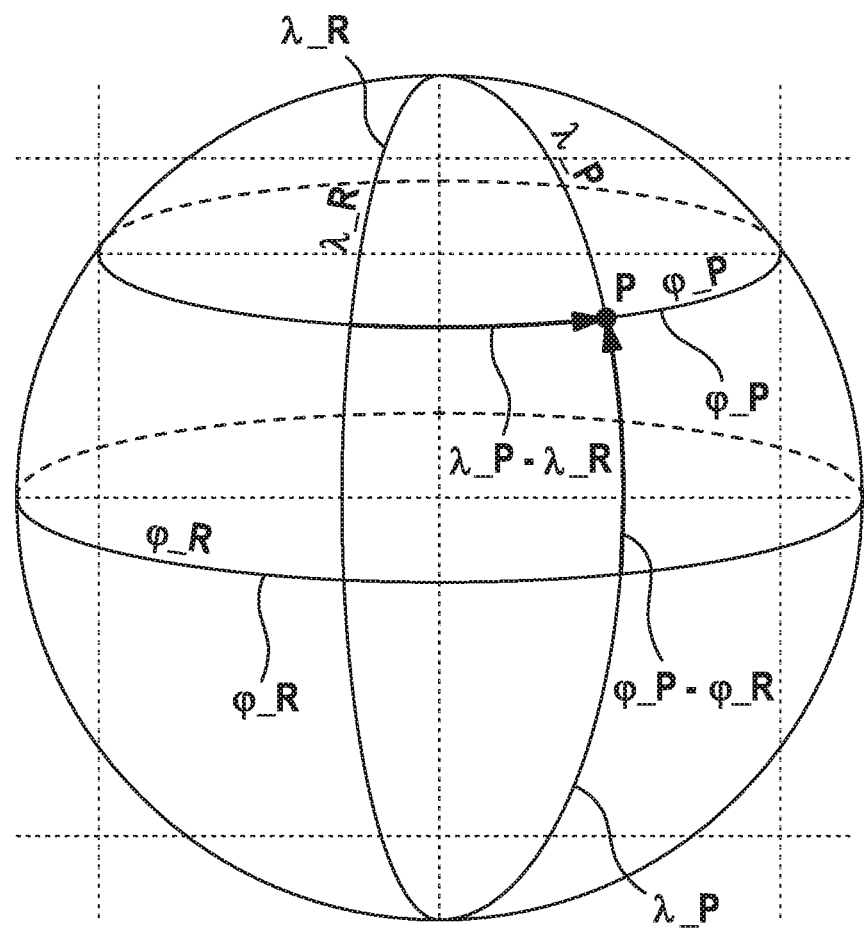
FIG. 2 shows a representation of a transformation of a point P in accordance with the method according to the invention (not to scale)

The positions are originally encoded in accordance with WGS-84 and contain information about the longitude and the latitude. Each of these points may therefore be mapped on the globe on the basis of the information, as shown in FIG. 2. The points $P\_1$ to $P\_6$ are transformed in the ego-vehicle into a second local coordinates system for V2X applications. In FIG. 1, the current position $P\_0$ of the ego-vehicle is indicated as the point of origin of the local coordinates system, which however only constitutes one example. Depending on the application, the point $P\_0$ may also be retained over a certain period of time or application period regardless of whether the ego-vehicle continues moving or not. The transformed local coordinates may be used in order to generate, for example, a region 3 by means of multiple points $P\_1$ to $P\_6$. V2X-relevant information may then be stored for this region 3 such as, for example, road-related weather data. In this way, drivers following the vehicle could be warned about icy roads or other hazards.

The method according to the invention is described in more detail, by way of example, for the point P from FIG. 2. In order to transform the position information regarding point P into a two-dimensional coordinates system, a reference longitude and a reference latitude are initially fixed. The reference latitude $\varphi\_R$ is, as a general rule, the equator. The reference longitude $\lambda\_R$ is advantageously stipulated in such a manner that it is located near to the respective position P. The longitude $\lambda\_0$ and the latitude $\varphi\_0$ of the position of the ego-vehicle $P\_0$ could also be used as the reference longitude $\lambda\_R$ and the reference latitude. The distance between the current position P and the reference longitude in the alignment of the latitude should advantageously be less than 10 km, particularly preferably less than 1 km, for the applications in a vehicle system.

In order to calculate the local x-coordinate, the distance between the reference longitude $\lambda\_R$ and the point P is calculated in accordance with the following equation $$x\_P=r*(\lambda\_P-\lambda\_R)*\cos(\varphi\_P)$$

where
r is the earth radius,
$\lambda\_P$ is the longitude of the position,
$\lambda\_R$ is the reference longitude, and
$\varphi\_P$ is the latitude of the position.

In this case, the radius in accordance with the WGS-84 standard may be taken as the radius, according to which standard the radius is 6371000.8 m. In this way, the distance for the x-coordinate is obtained in meters. If the longitude $\lambda\_0$ of the position $P\_0$ of the ego-vehicle is taken as the reference longitude, $\lambda\_0$ is to be used instead of $\lambda\_R$ in the above equation.

The distance from the reference latitude $\varphi\_P$ to the point P is calculated in an appropriate manner, which then corresponds to the y-coordinate. If the equator is taken as the reference latitude, the equation is as follows:

$$y\_P=r*\varphi\_P$$

and the distance of the point P from the equator in meters is obtained in this way. If the latitude $\varphi\_0$ of the position of the ego-vehicle is taken as the reference longitude, the equation is as follows:

$$y\_P=r*(\varphi\_P-\varphi\_0).$$

In this way, all points $P\_1$ to $P\_6$ may be calculated. If the position of the ego-vehicle $P\_0$ is chosen as the point of origin of the local coordinates system, the resulting y-coordinate of the points $P\_1$ to $P\_6$ would be the difference from $P\_0$. The advantage of this is that the values for the y-coordinates are relatively small and, in the event of a limited bit number, for example 32-bits, the local y-coordinates may still be precisely mapped despite the limited bit number. In particular, the calculation is simplified by inserting the latitude $\varphi\_0$ of the ego-position into the cosine term during the determination of the x-coordinate, so that the equation $$x\_P\_i=r*(\lambda\_P\_i-\lambda\_0)*\cos(\varphi\_0)$$

is applied with a constant $\cos(\varphi\_0)$ for $P\_1$ to $P\_6$.

As a result, the invention has substantial advantages, compared with the known method from the prior art, in that the distance between the position and the reference longitude and the reference latitude is calculated based on the difference of the angles (in radians) of the spherical coordinates. In addition, the distortion error is further decreased by means of a suitable selection of the first reference longitude near to a current position.

The reverse transformation of position information from a local coordinates system into a global coordinates system is accordingly carried out by means of an algebraic solution of the aforementioned equations according to the longitude and latitude $\lambda\_P$ and $\varphi\_P$ respectively:

Longitude by means of $$\lambda\_P=x\_P/(r*\cos(\varphi\_P))+\lambda\_R$$

or $$\lambda\_P=x\_P/(r*\cos(\varphi\_R))+\lambda\_R$$

and latitude by means of $$\varphi=y\_P/r$$

or $$\varphi=y\_P/r+\varphi\_R$$

wherein $\lambda\_R$ and $\varphi\_R$ may also correspond to the coordinates of the ego-position $\lambda\_0$ and $\varphi\_0$.

Figure 3:
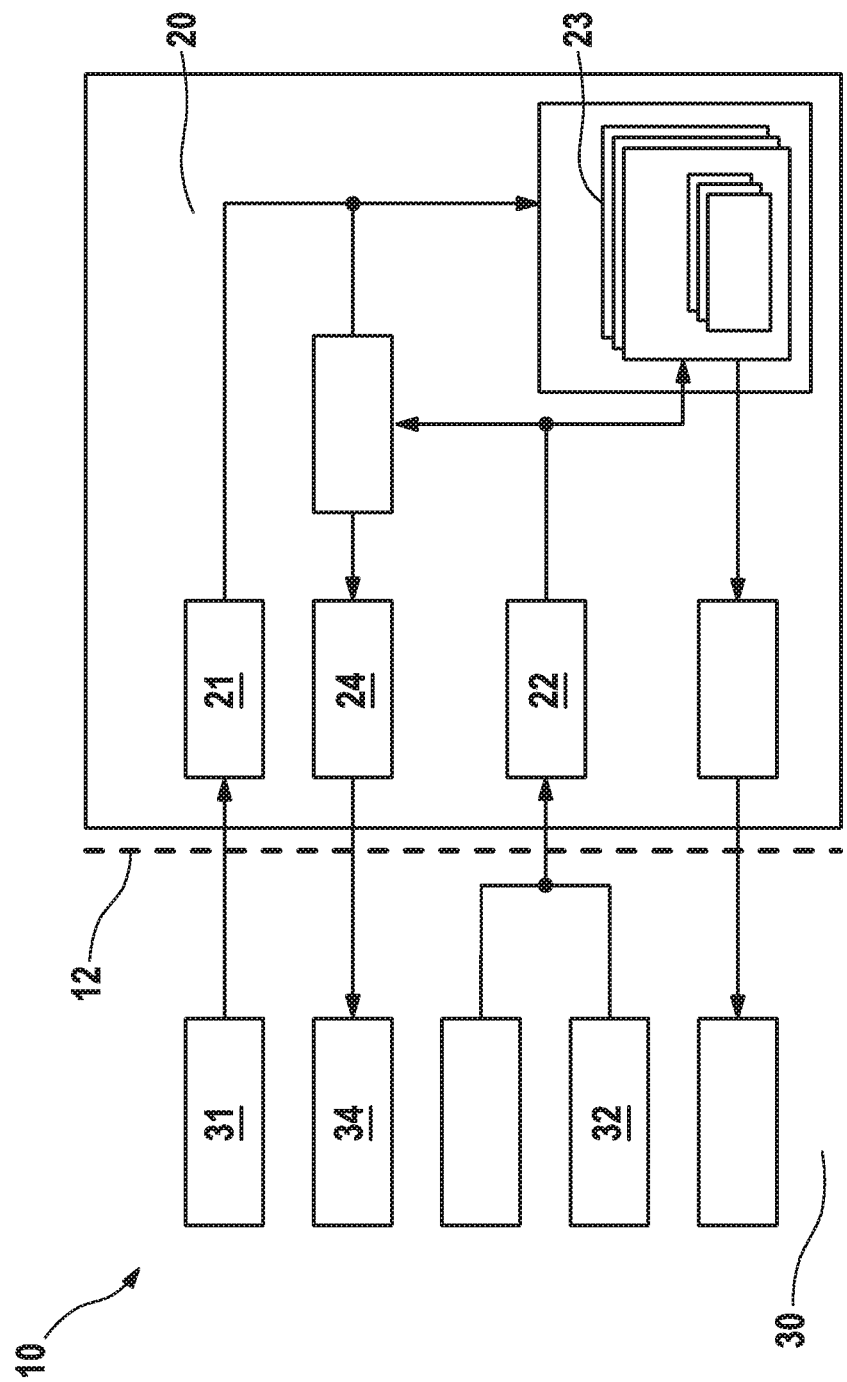
FIG. 3 shows a schematic block diagram of a vehicle system according to the invention.

FIG. 3 shows a vehicle system 10 for the transformation of information relating to at least one position on a globe from a first global coordinates system into a second local coordinates system, wherein the position in the first global coordinates system is provided by means of information relating to the longitude and a latitude, and wherein the position in the second local coordinates system is provided in terms of two axes arranged orthogonally to one another. The aforementioned method is executed by means of the vehicle system 10 described here, so that the particulars of the method itself will not be dealt with in greater detail.

The vehicle system 10 comprises an application block 20 which is connected by means of multiple interfaces 12 with other components of the vehicle and which is shown summarized in FIG. 3 as its own component block 30.

The component block 30 comprises multiple receivers for receiving position signals. Firstly, the system contains a message receiver 31 for receiving messages from other road users. In addition, there is at least one GNSS position module 32 for determining position data of the ego-vehicle.

The application block 20 accordingly comprises data recorders 21, 22 which initially record the data transmitted by the message receiver 31 or GNSS position module 32. The data recorder 21, 22 is designed in such a manner that it only records the transmitted data. Alternatively, the transformation of the coordinates could already take place in the data recorders 21, 22. In the former case, the transformation could also take place in a calculation unit 23 which links the local position data with application-specific data. In the latter case, the data recorders 21, 22 themselves are to be understood to be calculation units.

A message transmitter 24 is also part of the application block 20, by means of which the messages generated by the calculation unit 23 may be transmitted by means of corresponding components 34 for sending messages to other road users. Prior to dispatching the messages, a reverse transformation of the local position information into a global coordinates system, e.g. the WGS-84 format, takes place as described above. This reverse transformation may also similarly take place directly in the message transmitter or in the calculation unit 23.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for transforming information relating to at least one position of a vehicle on a globe from a first global coordinates system into a second local coordinates system as the vehicle is moving, the method comprising:
   receiving, at data recorders supported by the vehicle, a signal containing information relating to a global position of the vehicle in the first global coordinates system having a longitude and a latitude, the signal received from at least one of a GNSS position module or another road user by way of vehicle-to-vehicle communication;
   selecting, at a calculation device in communication with the data recorders, a reference longitude near the global position;
   determining, at the calculation device, a first distance (x) between the global position and the reference longitude;
   selecting, at the calculation device, a reference latitude;
   determining, at the calculation device, a second distance (y) between the global position and the reference latitude; and
   determining, at the calculation device, a local position of the vehicle in the second local coordinate system, the local position includes a first local axis and a second local axis arranged orthogonally to one another, the first distance (x) being a first coordinate of the position of the vehicle for the first local axis and the second distance (y) being a second coordinate of the position of the vehicle for the second local axis;
   wherein the reference latitude and/or the reference longitude is fixed for an application period of time, the application period of time adjusted as a function of a vehicle speed.

2. The method according to claim 1, wherein the reference latitude is near the global position.

3. The method according to claim 1, further comprising: calculating the distance for the first local axis using the equation:

$x\_P = r*(\lambda\_P - \lambda\_R)*\cos(\varphi\_P)$, where r is the earth radius,
   $\lambda\_P$ is the longitude of the position,
   $\lambda\_R$ is the reference longitude, and
   $\varphi\_P$ is the latitude of the position.

4. The method according to claim 3, further comprising: calculating the distance for the first local axis using the equation $x\_P = r*(\lambda\_P - \lambda\_R)*\cos(\varphi\_R)$.

5. The method according to claim 4, further comprising: calculating the distance for the second local axis using the equation:

$y\_P = r*(\varphi\_P - \varphi\_R)$, where r is the earth radius,
   $\varphi\_P$ is the latitude of the position, and
   $\varphi\_R$ is the reference latitude.

6. The method according to claim 5, further comprising using the equator as the reference latitude such that the distance for the second local axis is calculated using the equation $y\_P = r*\varphi\_P$.

7. The method according to claim 1, further comprising: calculating the first distance (x) and the second distance (y) in radians.

8. The method according to claim 1, further comprising: determining a vehicle position;
   selecting the longitude of the vehicle position as the reference longitude.

9. The method according to claim 8, further comprising: selecting the latitude of the vehicle position ego position as the reference latitude.

10. The method according to claim 1, wherein the application period of time is shorter than 120 seconds.

11. The method according to claim 1, further comprising: linking, at the calculation device, application-specific data with the local position, the application-specific data includes road-related weather data.

12. A vehicle system for transforming information relating to a vehicle position on a globe from a first global coordinates system into a second local coordinates system, the vehicle system comprising:
    a receiver receiving position signals of the vehicle in a global coordinate system, the position signals include a global position of the vehicle having a longitude and a latitude; and
    a calculation unit for:
      selecting a reference longitude near the global position;
      determining a first distance (x) between the global position and the reference longitude;
      determining a second distance (y) between the global position and a reference latitude; and
      determining a local position of the vehicle in the second local coordinate system, the local position includes a first local axis and a second local axis arranged orthogonally to one another, the first distance (x) being a first coordinate of the position of the vehicle for the first local axis and the second distance (y) being a second coordinate of the position of the vehicle for the second local axis;
    wherein the reference latitude and/or the reference longitude is fixed for an application period of time, the application period of time adjusted as a function of a vehicle speed.

* * * * *